(12) United States Patent
Chan et al.

(10) Patent No.: US 8,546,158 B2
(45) Date of Patent: Oct. 1, 2013

(54) METHOD FOR DISTRIBUTING PHOSPHOR PARTICULATES ON LED CHIP

(75) Inventors: Shiun-Wei Chan, Hsinchu (TW); Chih-Hsun Ke, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 267 days.

(21) Appl. No.: 13/178,520

(22) Filed: Jul. 8, 2011

(65) Prior Publication Data

US 2012/0100646 A1    Apr. 26, 2012

(51) Int. Cl.
    *H01L 21/00*  (2006.01)
(52) U.S. Cl.
    USPC ............................................. 438/27; 438/29
(58) Field of Classification Search
    USPC ...................................................... 438/27, 29
    See application file for complete search history.

(56) References Cited

U.S. PATENT DOCUMENTS

| | | | |
|---|---|---|---|
| 2002/0187571 A1* | 12/2002 | Collins et al. | 438/29 |
| 2007/0045761 A1* | 3/2007 | Basin et al. | 257/440 |
| 2007/0148332 A1* | 6/2007 | Lee et al. | 427/66 |
| 2009/0050901 A1* | 2/2009 | Gadkaree et al. | 257/77 |
| 2009/0050911 A1* | 2/2009 | Chakraborty | 257/89 |

* cited by examiner

*Primary Examiner* — Charles Garber
*Assistant Examiner* — Ron Pompey
(74) *Attorney, Agent, or Firm* — Altis & Wispro Law Group, Inc.

(57) ABSTRACT

A method for distributing phosphor particulates on an LED chip, includes steps of: providing a substrate having an LED chip mounted thereon; dispensing an adhesive on the chip, wherein the adhesive have positively charged phosphor particulates doped therein; providing an upper mold and a lower mold for producing an electric field through the adhesive and moving the upper mold to press the adhesive, wherein the phosphor particulates are driven by the electric field to move to a top face of the chip; and curing the adhesive and removing the upper mold and the lower mold.

16 Claims, 8 Drawing Sheets

METHOD FOR DISTRIBUTING PHOSPHOR PARTICULATES ON LED CHIP

BACKGROUND

1. Technical Field

The present disclosure relates to a method for forming an LED (light emitting diode), and more particularly, to a method for distributing phosphor particulates on an LED (light emitting diode) chip of the LED.

2. Description of Related Art

As new type light source, LEDs are widely used in various applications. A conventional LED includes a base, a pair of leads fixed in the base, a die mounted on the base and electrically connected to the leads and an encapsulant secured to the base and sealing the die. In order to produce white light, the die is made of a predetermined material to emit blue light, and large quantities of yellow phosphor particulates are doped in the encapsulant. The yellow phosphor particulates absorb the blue light from the die and are excited thereby to produce yellow light. The yellow light mixes with the blue light to generate white light.

There are two methods in the art to distribute the phosphor particulates on the die. One method is to dispose a shade around the die, and then spray the phosphor particulates on the die via a nozzle. However, the method leaves a large number of phosphor particulates on the shade, causing waste of the phosphor. The other method is to directly dispense the phosphor particulates on the die. This method is also unsatisfied since the phosphor particulates are not distributed uniformly.

What is needed, therefore, is a method for distributing phosphor particulates on an LED chip which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Referring to FIGS. 1-5, a method for distributing phosphor particulates 40 on a chip 20 in accordance with a first embodiment of the present disclosure is disclosed.

Figure 1:
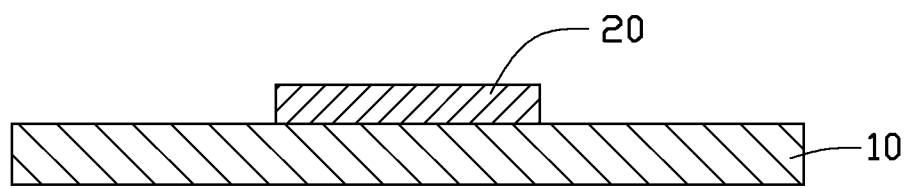
FIG. 1 shows a first step of a method of a first embodiment of the present disclosure.

Firstly, a substrate 10 having a chip 20 mounted thereon is provided as shown in FIG. 1. The substrate 10 may be made of a heat conductive material such as metal, ceramic or other suitable materials. The chip 20 may be made of GaN, AlGaN, InAlGaN or other light emitting semiconductor materials. Preferably, the chip is a GaN chip which emits blue light when energized.

Figure 2:
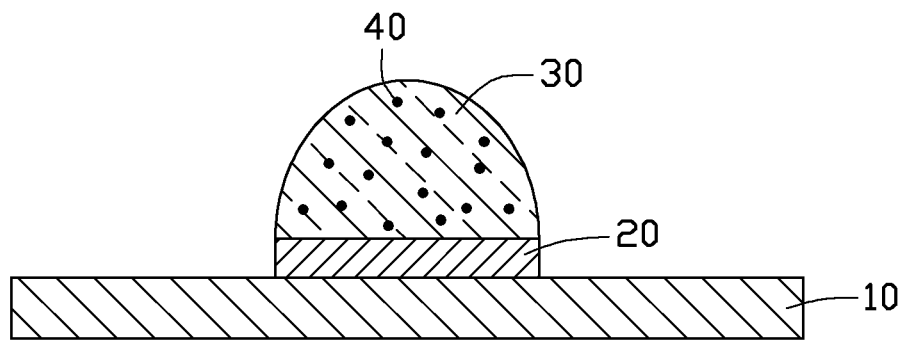
FIG. 2 shows a second step of the method of the first embodiment of the present disclosure.

Then an adhesive 30 containing phosphor particulates 40 therein is dispensed on a top face of the chip 20 as shown in FIG. 2. The adhesive 30 may be made of epoxy, silicone, polycarbonate, polymethylmethacrylate or other transparent materials. The adhesive 30 is heated to be in fluid or colloid state so that the phosphor particulates 40 doped therein are movable within the adhesive 30. The phosphor particulates 40 may be made of silicate compound, nitrides compound, YAG:Ce (cerium doped yttrium aluminum garnet), YAG:Tb (terbium doped yttrium aluminum garnet), or other suitable light-excitation materials. However, YAG:Ce is preferable in this embodiment for producing yellow light after absorbing and being excited by the blue light from the chip 20. The phosphor particulates 40 are randomly distributed within the adhesive 30 when the adhesive 30 is initially applied on the chip 20.

Moreover, the phosphor particulates 40 are treated to be positively charged beforehand. The process of treating the phosphor particulates 40 to be positively charged may be implemented by dipping the phosphor particulates 40 in a solution consisting of isopropano and magnesium nitrate, wherein Mg ions of the magnesium nitrate are adhered on peripheries of the phosphor particulates 40 so that the phosphor particulates 40 are positively charged. Then the phosphor particulates 40 are separated from the solution and baked. Finally the phosphor particulates 40 are doped in the adhesive 30. Alternatively, the phosphor particulates 40 can also be treated by other methods to be negatively charged.

Figure 3:
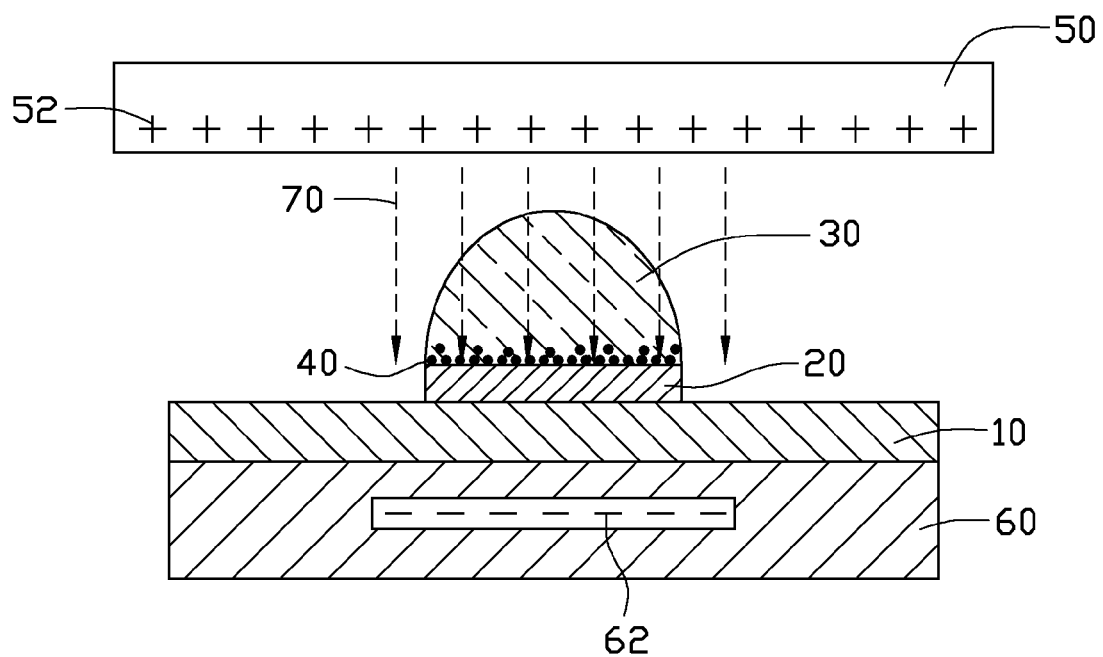
FIG. 3 shows a third step of the method of the first embodiment of the present disclosure.

As shown in FIG. 3, an upper mold 50 and a lower mold 60 are further provided above and below the adhesive 30, respectively. The upper mold 50 is spaced a distance from a top end of the adhesive 30. The upper mold 50 has positive charges 52 uniformly distributed all over a bottom face thereof. The lower mold 60 is located below and contacts a bottom face of the substrate 10. The lower mold 60 has negative charges 62 distributed in an inner cavity (not labeled) thereof which is positioned under the chip 20. The inner cavity of the lower mold 60 where the negative charges 62 occupy has an area which is a little larger than that of the chip 20 but much less than that of the bottom face of the upper mold 50. In order to prevent the negative charges 62 from affecting the chip 20 mounted on the substrate 10, an insulating layer (not shown) may be further provided between the substrate 10 and the lower mold 60. The positive charges 52 on the upper mold 50 and the negative charges 62 on the lower mold 60 cooperatively produce an electric field 70. The electric field 70 is oriented along a direction opposite to that light from the chip 20 is oriented. In the embodiment, a part of the electric field 70 neighboring the chip 20 is oriented downwardly, vertically and perpendicular to the substrate 10. Therefore, the positive phosphor particulates 40 randomly distributed within the adhesive 30 is driven by the electric field 70 to move downwardly towards the chip 20, and finally accumulated on the top face of the chip 20.

Figure 4:
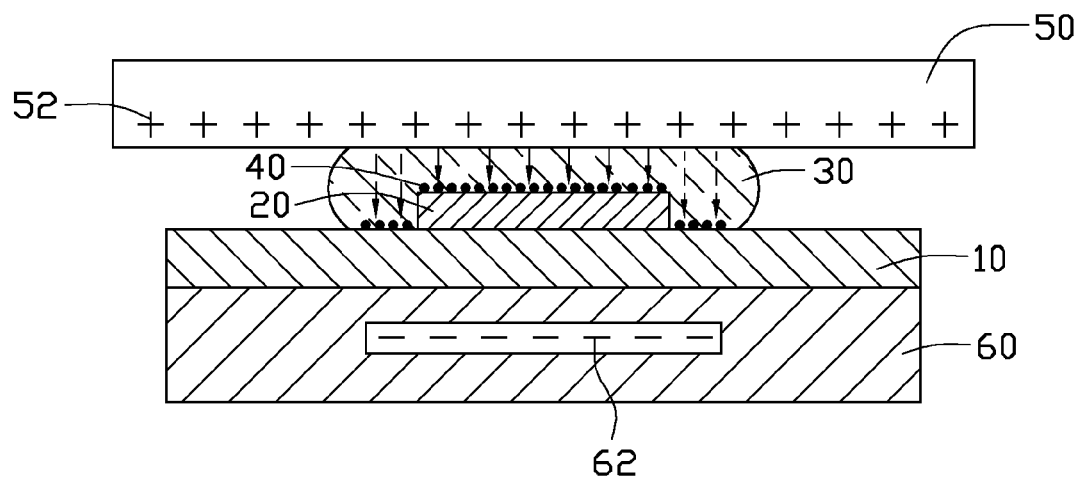
FIG. 4 shows a forth step of the method of the first embodiment of the present disclosure.

The upper mold 50 is then brought to move towards the lower mold 60 to press against the top end of the adhesive 30 as shown in FIG. 4. Under the pressure of the upper mold 50, the adhesive 30 is expanded laterally to cover lateral sides of the chip 20, thereby substantially containing the chip 20 therein. However, a total thickness of the adhesive 30 should be kept larger than that of the chip 20, thereby preventing the upper mold 50 from directly engaging with the chip 20. A direct engagement between the upper mold 50 and the chip 20 may damage the chip 20. A part of the phosphor particulates 40 is driven by the electric field 70 to move to lateral portions of the adhesive 30 beside the chip 20 and accumulated on a top face of the substrate 10 around the chip 20.

Figure 5:
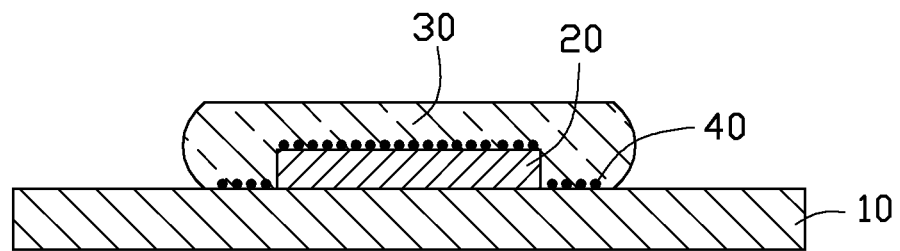
FIG. 5 shows phosphor particulates which have been deposited on a chip after the steps of FIGS. 1-4.

Finally, as shown in FIG. 5, the upper mold 50 and the lower mold 60 are removed from the adhesive 30 and the substrate 10, respectively. The adhesive 30 is further cured to harden, thereby fixing the positions of the phosphor particulates 40. Alternatively, the adhesive 30 can be firstly cured and then the upper mold 50 and the lower mold 60 are removed, depending on the actual manufacturing requirement.

The phosphor particulates 40 can be uniformly distributed near the chip 20 by action of the electric field 70, whereby the resultant light from the chip 20 and the phosphor particulates 40 is also uniform. Furthermore, the phosphor particulates 40 are fully used in the manufacturing processes without significant waste.

Figure 6:
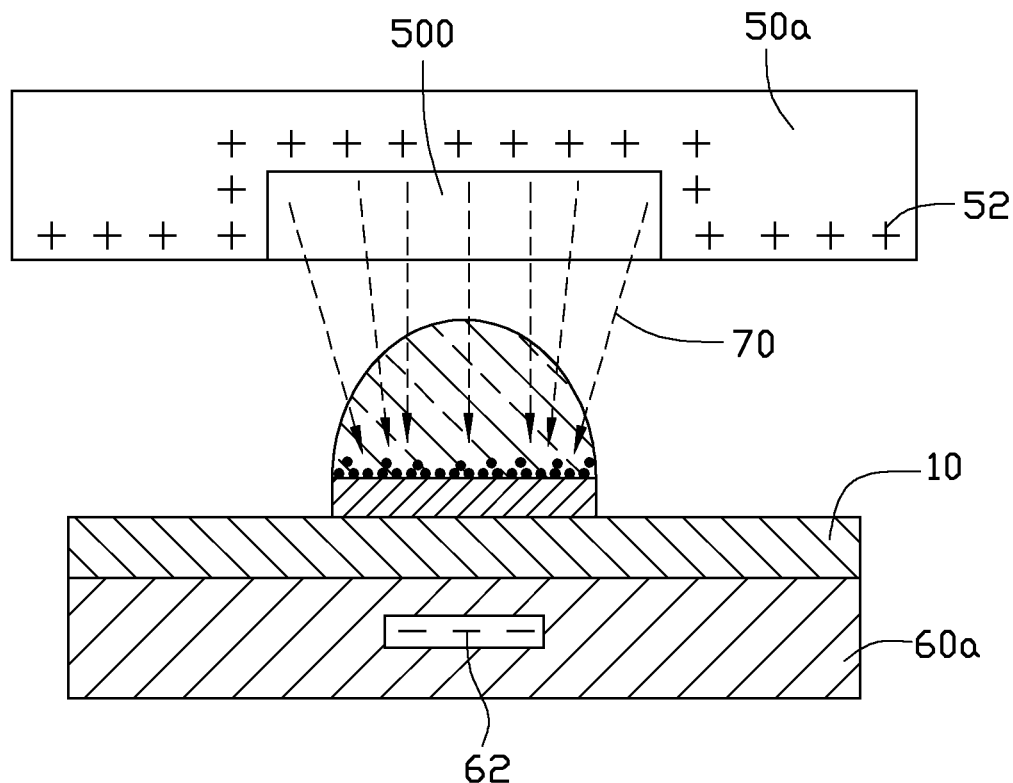
FIG. 6 is similar to FIG. 3, showing a third step of a method of a second embodiment of the present disclosure.
Figure 7:
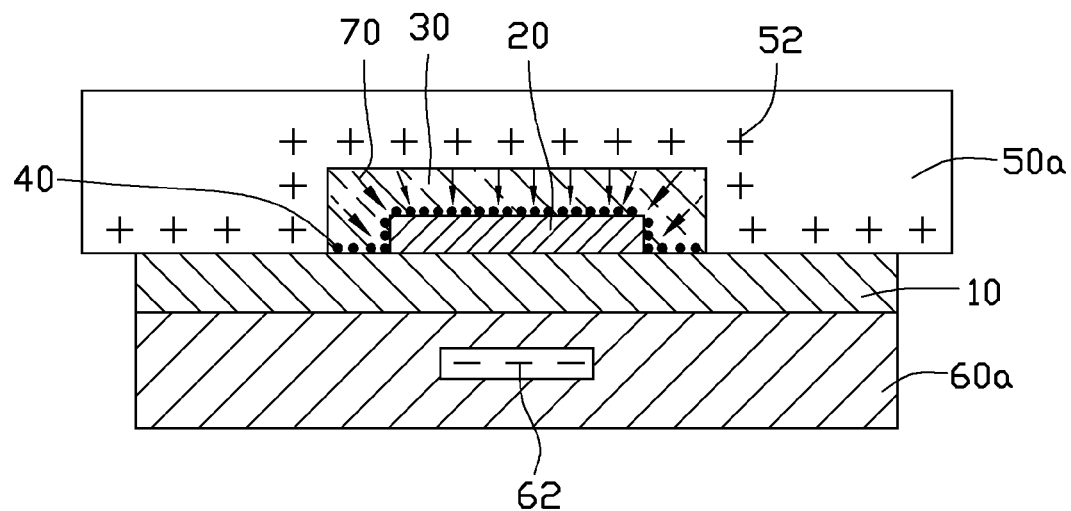
FIG. 7 is similar to FIG. 4, showing a step following the step of FIG. 6 of the method of the second embodiment of the present disclosure.
Figure 8:
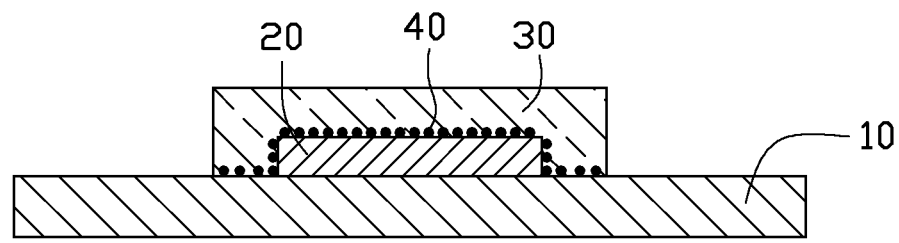
FIG. 8 is similar to FIG. 5, showing phosphor particulates which have been deposited on a chip after the steps of FIGS. 6-7.

Referring to FIGS. 6-8, a method for more uniformly distributing the phosphor particulates 40 on the chip 20 in accordance with a second embodiment of the present disclosure is shown. The differences between the two methods of the first embodiment and the second embodiment are the configurations of the upper mold 50a and the lower mold 60a. The first mold 50a of the second embodiment defines a cavity 500 in a bottom face thereof. The cavity 500 has a volume approximately equal to or a little larger than a sum of volumes of the chip 20 and the adhesive 30, and occupies an area larger than that the chip 20 occupies. The first mold 50a has positive charges 52 uniformly distributed on the bottom face thereof and inner faces thereof around the cavity 500. The lower mold 60a has negative charges 62 distributed in an inner cavity (not labeled) thereof. The inner cavity is a little smaller than the chip 20 and located just below the chip 20.

As shown in FIG. 6, for pressing the adhesive 30, the upper mold 50a is located above and spaced a distance from the top end of the adhesive 30, and the lower mold 60a is located below and contacts the bottom face of the substrate 10. Since the inner cavity of the lower mold 60a is smaller than the chip 20, the electric field 70 generated between the positive charges and the negative charges converges downwardly. A central part of the electric field 70 near the chip 20 is oriented downwardly, vertically and perpendicular to the chip 20. A lateral part around the central part of the electric field 70 near the chip 20 is oriented downwardly and inclinedly towards the inner cavity of the lower mold 60a. The phosphor particulates 40 within the adhesive 30 are driven by the electric field 70 to accumulate on the top face of the chip 20.

The upper mold 50a is further brought to move towards the lower mold 60a as shown in FIG. 7. During movement of the upper mold 50a, the adhesive 30 is received in the cavity 500 of the upper mold 50a and pressed by the inner faces of the upper mold 50a to expand laterally and cover lateral sides of the chip 20, whereby the adhesive 30 has a shape corresponding to a shape of the cavity 500. A part of the phosphor particulates 40 stays on the top face of the chip 20, another part of the phosphor particulates 40 is driven by the inclined lateral part of the electrical field 70 to move on the top face of the substrate 10, and a remaining part of the phosphor particulates 40 is driven by the inclined lateral part of the electrical field 70 to adhere on the lateral sides of the chip 20. Therefore, all light emitting faces of the chip 20 are covered by the phosphor particulates 40, and the light emitted from the chip 20 can be more uniform to mix with the light produced from the phosphor particulates 40.

Finally, as shown in FIG. 8, the upper mold 50a and the lower mold 60a are then removed from the adhesive 30 and the substrate 10, and the adhesive 30 is cured to harden before or after removal of the upper mold 50a and the lower mold 60a.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for distributing phosphor particulates on an LED (light emitting diode) chip, comprising steps:
   providing an LED chip;
   forming an adhesive on a top face of the LED chip, the adhesive containing charged phosphor particulates which are movable within the adhesive; and
   placing the adhesive in an electric field to drive the charged phosphor particulates to distribute on the top face of the chip;
   wherein the electric field is generated between an upper mold and a lower mold, the upper mold being located above the adhesive and the lower mold being located below the chip.

2. The method of claim 1, wherein the upper mold is firstly spaced from a distance a top end of the adhesive and then moves towards the lower mold.

3. The method of claim 2, wherein the upper mold presses the adhesive to expand laterally during movement of the upper mold towards the lower mold.

4. The method of claim 3, wherein the adhesive covers lateral sides of the chip after being pressed by the upper mold.

5. The method of claim 3, wherein the upper mold has first charges distributed on a first area thereof, and the lower mold has second charges distributed on a second area thereof, the first area of the upper mold being larger than the second area of the lower mold.

6. The method of claim 5, wherein the first area comprises a bottom face of the upper mold, and the second area is located in an interior of the lower mold.

7. The method of claim 5, wherein the second area is larger than an area of the chip.

8. The method of claim 5, wherein the electric field adjacent to the chip is oriented perpendicular to the top face of the chip.

9. The method of claim 5, further comprising a substrate supporting the LED chip thereon, wherein a part of the phosphor particulates is driven by the electric field to distribute on a top face of the substrate after the adhesive is pressed by the upper mold.

10. The method of claim 5, wherein the second area of the lower mold is smaller than an area of the chip.

11. The method of claim 5, wherein the electric field adjacent to the chip has a central part oriented perpendicular to the top face of the chip, and a lateral part oriented inclinedly with respect to the top face of the chip.

12. The method of claim 11, wherein the electric field converges from the upper mold towards the lower mold.

13. The method of claim 6, wherein the upper mold defines a cavity in a bottom face thereof, the first area further comprising inner faces of the upper mold defining the cavity.

14. The method of claim 9, wherein another part of the phosphor particulates is driven by the electric field to distribute on lateral faces of the chip after the adhesive being pressed by the upper mold.

15. The method of claim 1, wherein the upper mold and the lower mold are removed after the phosphor particulates are distributed on the top face of the chip, and the adhesive is then cured to harden.

16. The method of claim 1, wherein the adhesive is cured to harden after the phosphor particulates are distributed on the top face of the chip, and the upper mold and the lower mold are then removed.

\* \* \* \* \*